United States Patent
Sung et al.

(10) Patent No.: US 10,276,344 B2
(45) Date of Patent: Apr. 30, 2019

(54) POWER SUPPLY APPARATUS ABLE TO CONTROL OUTPUT CURRENT AND POWER SUPPLY METHOD USING THE SAME

(71) Applicants: NEW POWER PLASMA CO., LTD., Gyeonggi-do (KR); RESEARCH & BUSINESS FOUNDATION SUNGKYUNKWAN UNIVERSITY, Gyeonggi-do (KR)

(72) Inventors: Won Yong Sung, Gyeonggi-do (KR); Keun Wan Koo, Gyeonggi-do (KR); Byoung Kuk Lee, Gyeonggi-do (KR); Seung Hee Ryu, Gyeonggi-do (KR); Chang Seob Lim, Gyeonggi-do (KR); Hong Kweon Moon, Gyeonggi-do (KR)

(73) Assignee: NEW POWER PLASMA CO., LTD., Gyeonggi-Do (KR)

(*) Notice: Subject to any disclaimer, the term of this patent is extended or adjusted under 35 U.S.C. 154(b) by 0 days.

(21) Appl. No.: 15/664,520

(22) Filed: Jul. 31, 2017

(65) Prior Publication Data

US 2018/0247791 A1 Aug. 30, 2018

(30) Foreign Application Priority Data

Feb. 24, 2017 (KR) .......................... 10-2017-0024655

(51) Int. Cl.
*H02M 5/42* (2006.01)
*H01F 27/24* (2006.01)
(Continued)

(52) U.S. Cl.
CPC .............. *H01J 37/24* (2013.01); *H01F 27/24* (2013.01); *H01J 37/3244* (2013.01);
(Continued)

(58) Field of Classification Search
CPC ............. H05H 1/46; H05H 2001/4682; H05H 1/2406; H05H 13/00; H05H 1/24;
(Continued)

(56) References Cited

U.S. PATENT DOCUMENTS 8,333,166 B2 * 12/2012 Bolden, II ........ H01J 37/32082
118/723 E
D700,572 S * 3/2014 Esses .................... H01J 49/105
D13/108
(Continued)

FOREIGN PATENT DOCUMENTS

JP 11-288796 10/1999
KR 1020090077165 7/2009
(Continued)

OTHER PUBLICATIONS

Bo-Yuan Chen et al., "Switching Control Technique of Phase-Shift-Controlled Full-Bridge Converter to Improve Efficiency Under Light-Load and Standby Conditions Without Additional Auxiliary Components", IEEE Transactions on Power Electronics, Apr. 30, 2010, pp. 1001-1012, vol. 25, No. 4.
(Continued)

*Primary Examiner* — Wei (Victor) Chan
(74) *Attorney, Agent, or Firm* — Stuart H. Mayer; Mayer & Williams PC

(57) ABSTRACT

A power supply apparatus able to control an output current for maintaining plasma in a plasma generator includes: a switching power supply including a rectifier, an inverter, and a phase shifter; a plasma source connected to the switching power supply and generating the plasma in the plasma generator; a resonance network connected between the switching power supply and the plasma source and including a resonance inductor connected to a primary winding in series and a resonance capacitor connected to the plasma source in parallel and connected to the resonance inductor in
(Continued)

series; and a control unit controlling the switching power supply in order to phase-shift a voltage and a current provided to the resonance network.

6 Claims, 10 Drawing Sheets

(51) Int. Cl.
    *H01J 37/24*     (2006.01)
    *H01J 37/32*     (2006.01)
(52) U.S. Cl.
    CPC .. *H01J 37/32577* (2013.01); *H01J 37/32862* (2013.01); *H02M 5/42* (2013.01)
(58) Field of Classification Search
    CPC .. H05H 1/36; H05H 1/48; H05H 1/50; H05H 2001/2412; H05H 2001/2437; H05H 2001/4652; H05H 2001/4667; H05H 2245/121; H05H 5/04
    USPC ....... 118/723 E; 156/345.43–47; 219/121.41, 219/121.43, 121.57
    See application file for complete search history.

(56) References Cited

U.S. PATENT DOCUMENTS

| 2009/0000942 | A1* | 1/2009 | Bai | H01J 37/32082 |
| | | | | 204/164 |
| 2012/0035766 | A1* | 2/2012 | Shajii | H01J 37/321 |
| | | | | 700/274 |
| 2013/0200257 | A1* | 8/2013 | Chapon | H01J 49/105 |
| | | | | 250/282 |
| 2014/0361690 | A1* | 12/2014 | Yamada | H01J 37/32091 |
| | | | | 315/111.21 |
| 2015/0282289 | A1* | 10/2015 | Vahidpour | H05H 1/30 |
| | | | | 250/281 |
| 2017/0178865 | A1* | 6/2017 | Ulrich | H01J 37/32183 |

FOREIGN PATENT DOCUMENTS

| KR | 1020100010068 | 2/2010 |
| KR | 1020120133506 | 12/2012 |

OTHER PUBLICATIONS

Office Action issued by the Korean Intellectual Property Office dated Feb. 13, 2018.

* cited by examiner

PRIOR ART

PRIOR ART
(A) VOLTAGE AND CURRENT OF INVERTER ACCORDING TO THE RELATED ART (B) VOLTAGE AND CURRENT OF INVERTER ACCORDING TO THE PRESENT DISCLOSURE

POWER SUPPLY APPARATUS ABLE TO CONTROL OUTPUT CURRENT AND POWER SUPPLY METHOD USING THE SAME

CROSS-REFERENCE TO RELATED APPLICATION(S)

This application claims benefit of priority to Korean Patent Application No. 10-2017-0024655 filed on Feb. 24, 2017 in the Korean Intellectual Property Office, the disclosure of which is incorporated herein by reference in its entirety.

BACKGROUND

1. Field

The present disclosure relates to a power supply apparatus able to control an output current and a power supply method using the same, and more particularly, to a power supply apparatus able to control an output current providing power so as to maintain plasma in a plasma generator in a field of generating a reaction gas including ions, free radicals, atoms, and molecules, and a power supply method using the same.

2. Description of Related Art

Plasma discharge may be used to excite a gas to generate a reaction gas including ions, free radicals, atoms, and molecules. The reaction gas is used in numerous industrial and scientific applications including an application of processing a solid material such as a semiconductor wafer, powders, and other gases. A plasma state means a state in which a gas is ionized when high energy is given to the gas, and a plasma generating apparatus has been used in an etching process, a cleaning process, and the like, of processes of manufacturing a semiconductor in the modern times and the importance of the plasma generating apparatus has gradually increased in accordance with the growth of a semiconductor market.

Generally, several processes for manufacturing the semiconductor are performed in a semiconductor process, and byproducts generated in the semiconductor process are exhausted through a vacuum pump and a scrubber. In this case, a fine organic contaminant, oxide, or the like, generated in the semiconductor process is effectively removed using plasma.

There is a method of generating the plasma inside a process chamber or generating the plasma outside a process chamber. Here, as the method of generating the plasma outside a process chamber, there is a method of using a remote plasma generator. The remote plasma generator is an equipment of applying a high electric field to a neutral gas (argon) to separate some of the neutral gas into protons and electrons and generate plasma in which the neutral gas, the electrons, and the protons are mixed with one another by energy of the electric field.

A plasma supply source for the remote plasma generator may generate the plasma in various manners including direct current (DC) discharge, radio frequency (RF) discharge, and microwave discharge. The DC discharge is accomplished by applying a potential between two electrodes in the gas. The RF discharge is accomplished by transferring energy from a power supply into the plasma in a static electricity manner or an induction coupling manner. An induction coil is generally used to induce a current into the plasma. The microwave discharge is accomplished by directly coupling microwave energy into a discharge chamber accommodating a gas therein. The microwave discharge may be used to support a wide discharge condition including heavily ionized electron cyclone resonance (ECR) plasma.

A toroidal plasma supply source has advantages in terms of a lower electric field, low corrosion of a plasma chamber, miniaturization, and a cost effect as compared with a microwave plasma supply source or another type of RF plasma supply source. The toroidal plasma supply source generates plasma in an inductively coupled plasma (ICP) manner. A toroidal plasma generator has been used to chemically generate an active gas including fluorine, oxygen, hydrogen, nitrogen, or the like, in order to process a semiconductor wafer, a flat panel display, and various materials.

A gas supplied through a gas inlet of the toroidal plasma supply source moves along a toroidal plasma channel in the plasma chamber, and reacts to the plasma to generate an activated gas. A flow of the gas in the plasma chamber acts as impedance.

A predetermined level or more of energy is required in order to maintain the plasma state generated as described above. The toroidal plasma supply source using the ICP manner uses a magnetic field in order to supply energy to the gas, and supplies a current having a high frequency to a plasma generator in order to generate such a magnetic field. In the case in which a magnitude of such a current is reduced, it is difficult to maintain the gas in the plasma state, and the gas that is not maintained in the plasma state does not act as a load, but shows electrical resistance having an open form such as the atmosphere. A phenomenon that the predetermined level or more of energy is not supplied to the gas, such that the plasma is not maintained is called a drop-out phenomenon. After the plasma is ignited, an electrical resistance value is in an inverse proportion to a current applied to the plasma generator. Due to such a feature, in the case of using a resonant power supply apparatus in a plasma load, the drop-out phenomenon occurs.

In the case in which the drop-out phenomenon occurs, a problem occurs in processes such as the etching process, the cleaning process, and the like, of the processes of manufacturing a semiconductor, and the plasma generating apparatus should be restarted, such that temporal loss exists.

FIG. 1 is a view showing characteristics when plasma is operated as a load of a power supply apparatus after plasma is ignited, and FIG. 2 is a circuit diagram illustrating a resonance network according to the related art and a resonance network of a plasma generator.

Referring to FIG. 1, after plasma is ignited, a plasma load has an electrical resistance value that is in inverse proportion to a change in a current. In the case in which the power supply apparatus controls a current to be reduced through a frequency variation, an electrical resistance value of the plasma is increased depending on the reduced current. Therefore, an output current is reduced once again. A process in which the electrical resistance value of the plasma load is again increased by the reduced output current is repeated, such that the plasma load returns to an air form such as before the plasma is ignited. Therefore, there is a difficulty in controlling the output current by a general frequency control.

Referring to FIG. 2, currently, as a power supply apparatus for generating and maintaining the plasma, a resonant power supply apparatus easily outputting a constant current is used in order to generate and maintain the plasma even in a rapid resistance change condition before or after the plasma is ignited and generate a high frequency power required in the plasma. To this end, an LC parallel resonant network 1 is used. The resonant network 1 includes a resonance inductor 3 connected to a plasma generator 5 in series and a resonance capacitor 4 connected to the plasma generator 5 in parallel.

As the power supply apparatus for generating and maintaining the plasma, the resonant power supply apparatus easily outputting the constant current is used in order to generate and maintain the plasma even in the rapid resistance change condition before or after the plasma is ignited and generate the high frequency power required in the plasma. In such a system, a frequency variation is required in order to vary an output current.

In the resonant power supply apparatus, in the case of a general load, an impedance change of the load about an increase or a decrease in a current does not exist and an influence on a change in a Q-factor is low, but in the case of a plasma load, a series of changes in a Q-factor are generated due to an impedance change for an increase or a decrease in a current, such that it is difficult to obtain an output by a general frequency control. Particularly, conventionally, in operating the plasma generator after the plasma is ignited, the power supply apparatus was designed without considering the drop-out phenomenon, and thus performed only a current control through a frequency variation.

SUMMARY

An object of the present disclosure is to provide a power supply apparatus able to control an output current depending on specifications of a plasma generator so that a drop-out phenomenon does not occur using a phase shift method, and a power supply method using the same.

According to an aspect of the present disclosure, a power supply apparatus able to control an output current for maintaining plasma in a plasma generator includes: a switching power supply including a rectifier, an inverter, and a phase shifter; a plasma source connected to the switching power supply and generating the plasma in the plasma generator; a resonance network connected between the switching power supply and the plasma source and including a resonance inductor connected to a primary winding in series and a resonance capacitor connected to the plasma source in parallel and connected to the resonance inductor in series; and a control unit controlling the switching power supply in order to phase-shift a voltage and a current provided to the resonance network.

The plasma source may include: a plasma chamber including one or more gas inlets and one or more gas outlets, having a plasma discharge channel disposed therein and having a toroidal shape, and having a toroidal shape; and a transformer including a ferrite core installed in the plasma chamber so as to be interlinked with the plasma discharge channel and a primary winding wound around the ferrite core.

The switching power supply may include a half-bridge inverter.

The switching power supply may include a full-bridge inverter.

The one or more gas outlets may be connected to a process chamber processing a substrate.

The plasma chamber may include an ignition electrode for igniting the plasma in the plasma discharge channel.

The resonance network may include a passive element having one end connected to the resonance capacitor in series and the other end connected to a ground.

The passive element may include one or more of a resistor, an inductor, a capacitor, a trance, and a relay.

According to another aspect of the present disclosure, a power supply method using a power supply apparatus able to control an output current for supplying power for maintaining plasma in a plasma generator includes: providing a switching power supply including a rectifier, an inverter, and a phase shifter, a plasma source generating the plasma in the plasma generator, and a resonance network connected between the switching power supply and the plasma source and including a resonance inductor connected to a primary winding in series and a resonance capacitor connected to the plasma source in parallel and connected to the resonance inductor in series; confirming values of the resonance inductor and the resonance capacitor at which a maximum output current is output from the resonance network through a control unit; confirming a maximum phase shift angle at which a minimum output current is output from the resonance network through the control unit; confirming phases of a voltage and a current of the inverter at which zero voltage switching (ZVS) is possible at the maximum phase shift angle; and controlling an output current of the inverter using the control unit.

The resonance network may include a passive element having one end connected to the resonance capacitor in series and the other end connected to a ground.

The passive element may include one or more of a resistor, an inductor, a capacitor, a trance, and a relay.

DETAILED DESCRIPTION

Figure 1:
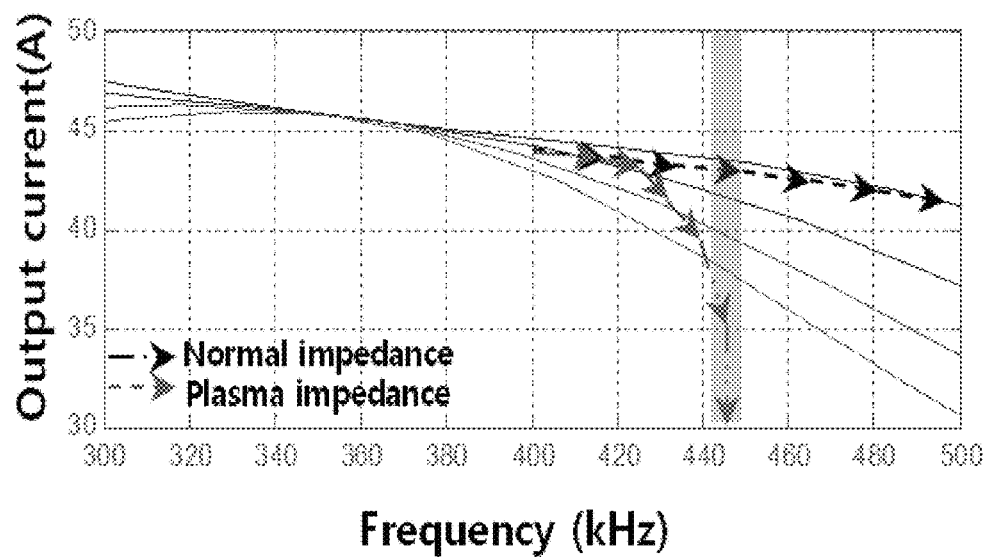
FIG. 1 is a view showing characteristics when plasma is operated as a load of a power supply apparatus after plasma is ignited.

Hereinafter, exemplary embodiments of the present disclosure will be described in detail with reference to the accompanying drawings. The same or similar components will be denoted by the same reference numerals independent of the drawing numerals, and an overlapping description for the same or similar components will be omitted. In addition, terms "module" and "unit" for components used in the following description are used only to easily make the disclosure. Therefore, these terms do not have meanings or roles that distinguish from each other in themselves. Further, when it is decided that a detailed description for the known art related to the present disclosure may obscure the gist of the present disclosure, the detailed description will be omitted. Further, it should be understandable that the accompanying drawings are provided only in order to allow exemplary embodiments of the present disclosure to be easily understood, and the spirit of the present disclosure is not limited by the accompanying drawings, but includes all the modifications, equivalents, and substitutions included in the spirit and the scope of the present disclosure.

Terms including ordinal numbers such as 'first', 'second', and the like, may be used to describe various components. However, these components are not limited by these terms. The terms are used only to distinguish one component from another component.

It should be understandable that when one component is referred to as being "connected to" or "coupled to" another component, it may be connected directly to or coupled directly to another component or be connected to or coupled to another component with the other component interposed therebetween. On the other hand, it should be understandable that when one element is referred to as being "connected directly to" or "coupled directly to" another element, it may be connected to or coupled to another element without the other element interposed therebetween.

Singular forms are intended to include plural forms unless the context clearly indicates otherwise.

It will be further understood that terms "include" or "have" used in the present specification specify the presence of features, numerals, steps, operations, components, parts mentioned in the present specification, or combinations thereof, but do not preclude the presence or addition of one or more other features, numerals, steps, operations, components, parts, or combinations thereof.

Hereinafter, an exemplary embodiment of the present disclosure will be described in detail with reference to the accompanying drawings. It is obvious to those skilled in the art that the present disclosure may be implemented in another specific form without departing from the spirit and the essential feature of the present disclosure.

Figure 3:
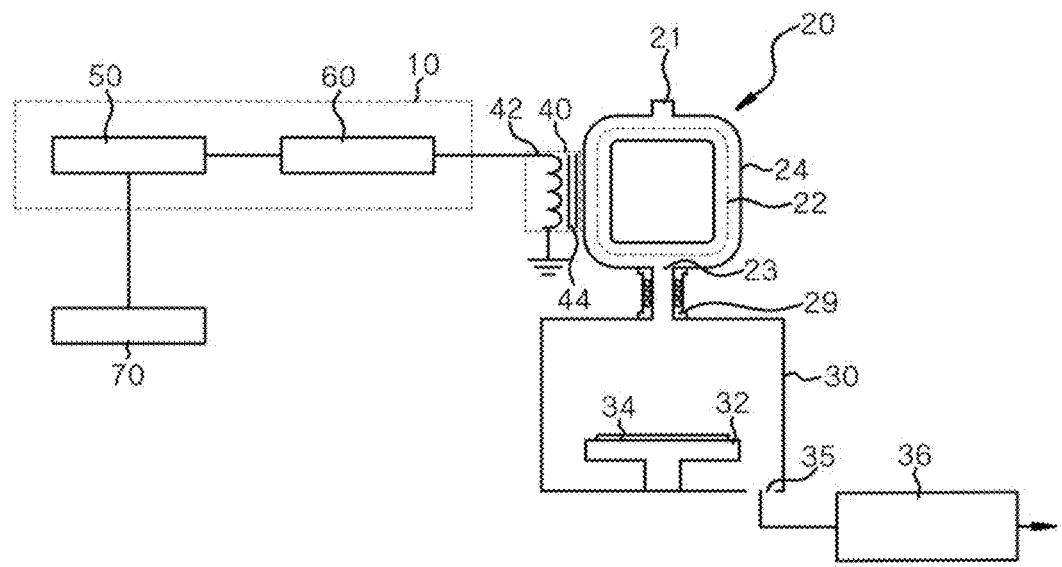
FIG. 3 is a view for describing a connection structure between a power supply apparatus, a plasma generator, and a process chamber according to the present disclosure.

FIG. 3 is a view for describing a connection structure between a power supply apparatus, a plasma generator, and a process chamber according to the present disclosure.

Referring to FIG. 3, a plasma generating system according to the present disclosure includes a power supply apparatus 10, a plasma generator 20, and a process chamber 30. The power supply apparatus 10 is a component for transferring energy into the plasma generator 20 in order to ignite plasma in the plasma generator 20. The power supply apparatus 10 includes a switching power supply 50 and a resonance network 60. The power supply apparatus 10 transfers the energy to the plasma generator 20 to ignite or generate the plasma in the plasma generator.

The plasma generator 20 includes a body 24 for accommodating a gas (for example, Ar) able to be converted into plasma (for example, Ar+) as a plasma source therein. One or more side surfaces of the body 24 are exposed to the process chamber 30 to allow charged particles generated by the plasma to be in direct contact with a material to be processed. Optionally, the plasma generator 20 is positioned to be spaced apart from the process chamber 30 by a predetermined distance, and allows an activated gas to flow into the process chamber 30.

The plasma generator 20 includes the body including a plasma discharge channel 22 disposed therein and having a toroidal shape and a transformer 40 forming electromagnetic energy in the plasma discharge channel 22 and coupling the electromagnetic energy to the plasma. The transformer includes a ferrite core 44 and a primary winding 42. The ferrite core 44 is installed to be interlinked with the plasma discharge channel 22 and surround a portion of the body 24. The primary winding 42 is wound around a portion of the ferrite core 44. A primary side of the transformer 40 includes the primary winding 42, and a secondary side of the transformer 40 includes the plasma formed in the plasma discharge channel 22. The primary winding 42 is connected to the power supply apparatus 10, and is driven by receiving power provided from the power supply apparatus 10. The energy from the power supply apparatus 10 is supplied to the transformer 40, and reacts to the gas passing through the plasma generator 20 to ignite or generate induced plasma. The plasma ignited in the plasma generator 20 serves as the secondary side of the transformer 40.

The power supply apparatus 10 applies a high excitation voltage to the primary winding 42 of the transformer 40. Such an excitation voltage induces a high voltage current in the primary winding 42 to generate an alternating current (AC) magnetic field through the ferrite core 44. As a result, the current is induced as the gas in the plasma generator 20 to cause the ignition of the plasma. Once the plasma is generated, the plasma is used to excite another source gas, thereby generating a desired reaction gas.

When the plasma is operated as a load of the power supply apparatus 10, it has an infinite resistance value before the plasma is ignited being similar to the air resistance in the atmosphere. However, the plasma is operated as the load of the power supply apparatus 10 together with a rapid resistance decrease after being ignited. In addition, a change in impedance is small during an operation of the plasma generator 20.

The process chamber 30 includes a suscepter 32 for supporting a substrate 34 to be processed. The suscepter 32 may be electrically connected to one or more bias power supply sources through an impedance matcher (not illustrated). A gas outlet 23 of the plasma generator 20 is connected to the process chamber 30 through an adapter 29, such that the activated gas is supplied from the plasma generator 20 to the process chamber 30 through the adapter 29. The adapter 29 may include an insulation section for electrical insulation, and may include a cooling channel (not illustrated) for preventing overheating. The substrate 34 to be processed may be, for example, a silicon wafer substrate for manufacturing a semiconductor apparatus or a glass substrate for manufacturing a liquid crystal display, a plasma display, or the like.

The plasma generator 20 supplies the activated gas to the process chamber 30. The activated gas supplied from the plasma generator 20 may be used for a cleaning purpose in order to clean an inner portion of the process chamber 30 or be used for a process purpose in order to process the substrate 34 to be processed, seated on the suscepter 32. The plasma generator 20 may use inductively coupled plasma, capacitively coupled plasma, or transformer plasma as a plasma source for exhausting the activated gas. Among them, the plasma generator 20 according to the present disclosure uses the transformer plasma.

Although not illustrated in the drawing, the plasma generator 20 may be installed between the process chamber 30 and an exhaust pump 36. The exhaust pump 36 is connected to an exhaust vent 35 of the process chamber 30. The plasma generator 20 receives a harmful gas (perfluorocarbon) generated in and exhausted from the process chamber 30, resolves the harmful gas into a harmless gas, and exhausts the harmless gas. The harmful gas, which is an environmental pollution material, may be resolved and exhausted, and damage to the exhaust pump 36 may be prevented, by the plasma generator 20. In this case, a separate plasma supply source may be provided.

A control unit 70, which is a component for controlling the entire system, is connected to the power supply apparatus 10 to control the power supplied to the plasma generator 20. Although not illustrated in detail, a protection circuit for preventing electrical damage that may be generated by an abnormal operation environment may be provided in the power supply apparatus 10. The control unit 70 generates control signals for controlling all the operation processes of the plasma processing system to control operations of the plasma generator 20 and the process chamber 30. The plasma generator 20 is provided with a measuring sensor (not illustrated) for measuring a plasma state, and the control unit 70 controls the power supply apparatus 10 while comparing a measured value with a reference value based on a normal operation, thereby controlling a voltage and a current of an inverter.

Figure 4:
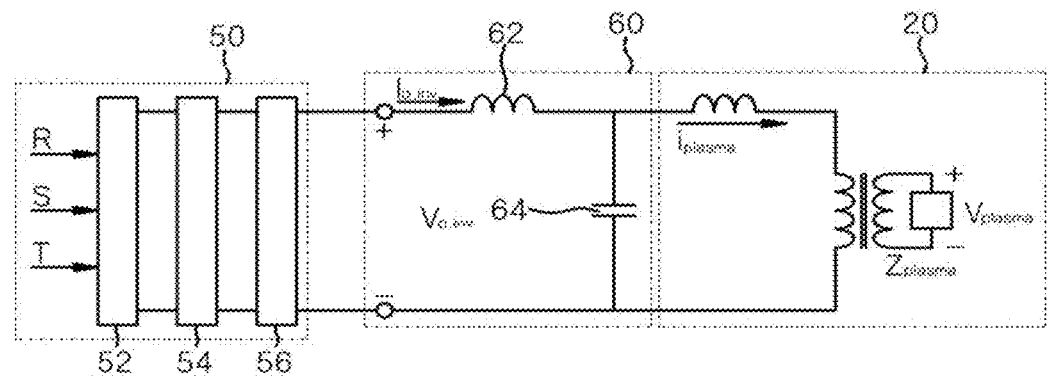
FIG. 4 is a circuit diagram illustrating a resonance network and a plasma generator according to an exemplary embodiment of the present disclosure.
Figure 5:
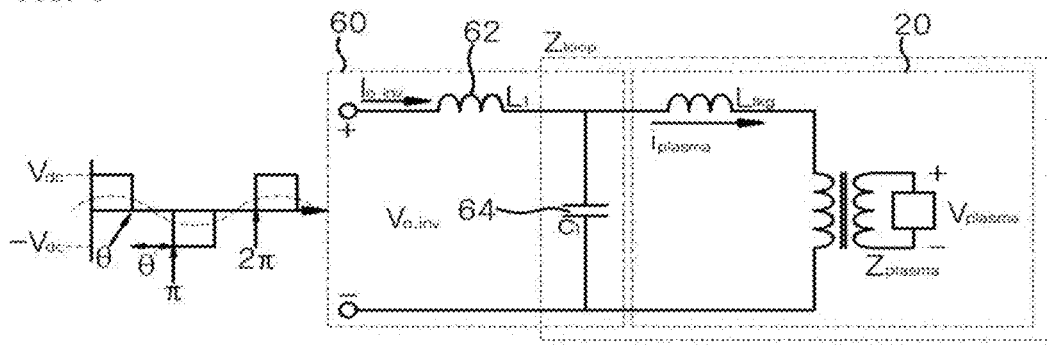
FIG. 5 is a circuit diagram illustrating a resonance network and a plasma generator in the case of applying a phase shift manner.

FIG. 4 is a circuit diagram illustrating a resonance network and a plasma generator according to an exemplary embodiment of the present disclosure, and FIG. 5 is a circuit diagram illustrating a resonance network and a plasma generator in the case of applying a phase shift manner.

Referring to FIG. 4, the power supply apparatus 10 according to the present disclosure includes the switching power supply 50 and the resonance network 60. The switching power supply 50 includes a rectifier 52, an inverter 54, and a phase shifter 56. The switching power supply 50 may be one of a half-bridge inverter and a full-bridge inverter. Direct current (DC) obtained by the rectifier 52 is inverted by the inverter 54 and is then provided to the phase shifter 56. The phase shifter 56 phase-shifts a current and a voltage output from the inverter 54.

The resonance network 60 is used as a resonance inductor of the primary winding 42, and is connected between the switching power supply 50 and the primary winding 42. In response to an excitation voltage from the switching power supply having a resonance frequency of the resonance network 60 or a frequency near the resonance frequency, the resonance voltage or a substantial resonance voltage is applied across the primary winding 42 of the transformer 40 inducing a high voltage. A resonance current in the primary winding 42 cause the plasma ignition in the plasma generator 20.

The resonance network 60 is driven by the switching power supply 50. The resonance network 60 includes an LC circuit having a resonance inductor 62 connected to a resonance capacitor 64 in series. The resonance capacitor 64 is connected to the primary winding 42 in parallel, and the resonance inductor 42 is connected to the primary winding 42 in series. The resonance inductor 62 and the resonance capacitor 64 form a low pass filter network. The excitation voltage is applied across the resonance network 60, such that the resonance network 60 provides a substantial resonance AC voltage across the primary winding 42 and inducts a substantial resonance current in the primary winding 42, thereby igniting the plasma in the plasma generator 20.

The generated plasma serves as the secondary side of the transformer 40. The plasma may be represented as an equivalent circuit having inductance L and reactance Z. $i_{plasma}$ in the inductor is a current to an output load $Z_{plasma}$ calculated depending on an impedance value according to an output voltage of the inverter. Meanwhile, the body 24 of the plasma generator 20 is manufactured in a toroidal shape or is manufactured in another shape providing an annular flow of the gas.

A phase shift control manner in the present disclosure, which is a method for reducing loss of a voltage and a current generated in a switch, is mainly used in a system requiring a high switching frequency. In the case of a general system, loss such as Won or Woff is generated in a portion in which a voltage and a current intersect with each other depending on a switching-on/off of the switch. In order to improve this point, resonance is generated at a point in time at which the switch is switched on/off to 'shape' a form of a voltage or a current at the moment when the switch is switched on/off to set the voltage or the current, such that the voltage or the current is set to be 0 or less, thereby reducing the loss generated in the switching-on/off of the switch (zero voltage switching (ZVS)).

In the related art, an output current is controlled by varying a switching frequency for the purpose of a change in impedance, but in the present disclosure, a magnitude of a fundamental frequency is controlled using a phase shift manner.

Figure 6A:
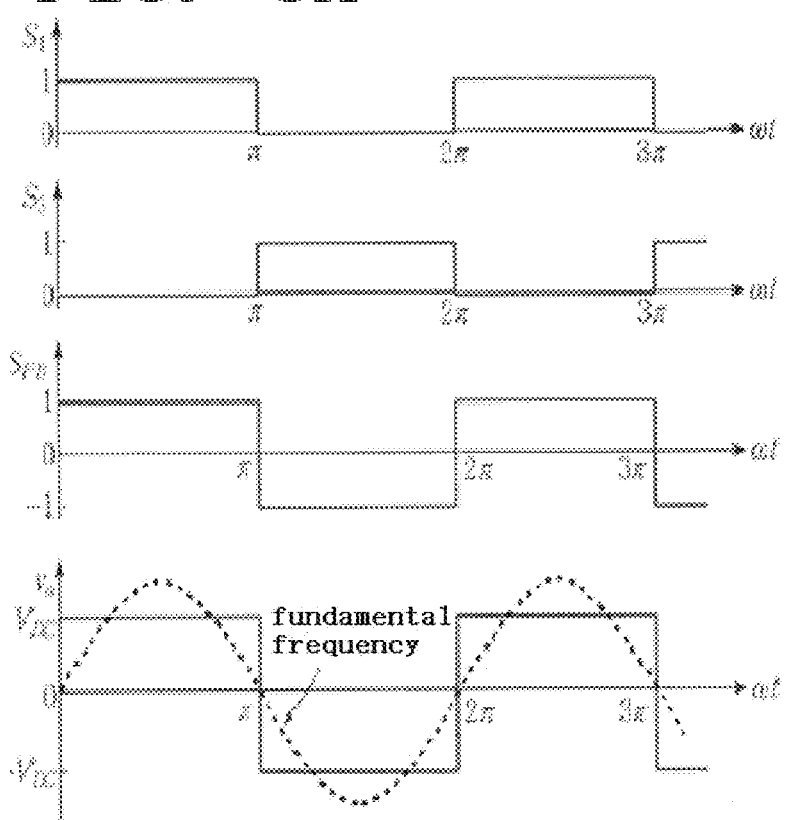
FIGS. 6A and 6B are views illustrating waveforms of voltages of an inverter depending on phase shift angles.
Figure 6B:
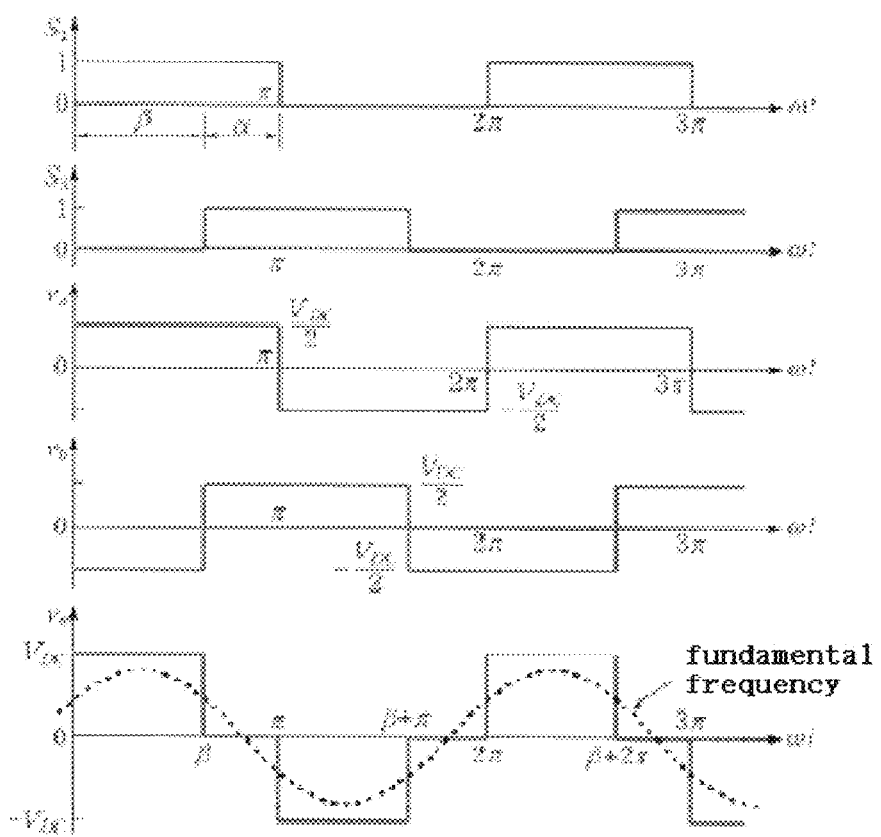
Figure 7:
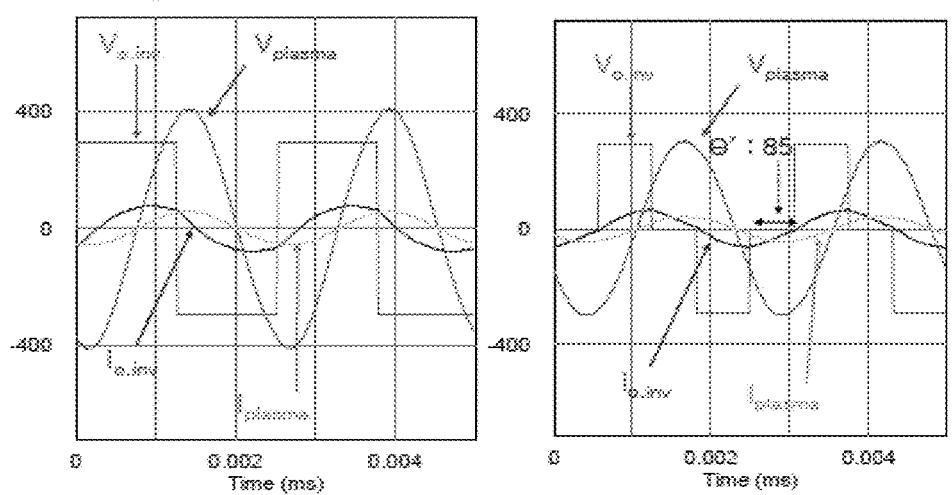
FIG. 7 is graphs illustrating waveforms of currents and voltages depending on phase shift angles.

FIGS. 6A and 6B are views illustrating waveforms of voltages Vo of an inverter depending on phase shift angles, and FIG. 7 is graphs illustrating waveforms of currents and voltages depending on phase shift angles.

FIG. 6A is graphs illustrating waveforms of voltages Vo of an inverter when a phase shift angle does not exist, and FIG. 6A is graphs illustrating waveforms of voltages Vo of an inverter when a phase shift angle exists.

Referring to FIGS. 6A and 6B, considering that the switch is switched on, if a phase difference is given between point in times at which a switch is switched on when times in which the switch is switched on or switched off are the same as each other, a magnitude of a voltage of an inverter represented by $V_{DC}$ is changed, and a phase difference in the voltage of the inverter is also changed by the changed magnitude of the voltage of the inverter.

Referring to FIG. 7, simulation waveforms represent magnitudes of output currents depending on phase shift levels. A red wavelength represents an output voltage of an inverter, a blue wavelength represents an output current of the inverter, and a purple wavelength represents a load-side current $I_{plasma}$. As an area of the red wavelength is gradually reduced due to a phase shift, a magnitude of a fundamental frequency corresponding to the red wavelength is also reduced, and a magnitude of $I_{plasma}$ is reduced by the fundamental frequency of which the magnitude is reduced. Therefore, the magnitude of the fundamental frequency may be controlled using the phase shift manner.

A method for maintaining plasma using the phase shift manner according to the present disclosure will be described below.

The power supply apparatus 10 generally provides a frequency of 400 KHz in order to maintain a plasma state. Therefore, a resonated frequency is selected in a region of 400 KHz or less, and it is required to set a resonance network for satisfying a maximum output current specification and a minimum output current specification. In order to set the resonance network, first, values of the resonance inductor 62 and the resonance capacitor 64 at which a maximum output current may be output from the resonance network 60 are confirmed by the control unit 70. In addition, a maximum phase shift angle at which a minimum output current may be output is calculated through the control unit 70. The phase shift angle may be calculated through the following Equation 1 and Equation 2.

$$v_{o.inv} = \frac{4V_{DC}}{\pi} \sum_{n=1,3,5,\ldots}^{\infty} \frac{\sin(n\theta/2)}{n} \cos[n(\omega t - \theta/2)] \quad \text{[Equation 1]}$$

$$i_{plasma} = \frac{Z_{loop}}{Z_{plasma}(sL_r + Z_{loop})} \frac{sL_m // Z_{plasma}}{sL_{ikg} + sL_m // Z_{plasma}} v_{o.inv} \quad \text{[Equation 2]}$$

$$(Z_{loop} = \frac{1}{sC_r} // (sL_{ikg} + sL_m // Z_{plasma})$$

$V_{DC}$ is a DC link voltage (input voltage) of an inverter n is an order $V_{o.inv}$ is an equation representing change levels in magnitudes of a fundamental frequency and a harmonic by a phase shift (is a term such a fundamental frequency or a harmonic in Fourier transformation)

$i_{plasma}$ is a current to an output load R: $Z_{plasma}$ calculated depending on an impedance value according to an output voltage of the inverter. Parallel impedance calculation is represented by parallel impedance A//B of A and B in order to simply represent an equation.

S indicates a variable in a frequency domain (s=jw).

In Equation 1, an output voltage $V_{o.inv}$ of the inverter when a phase shift is made may be confirmed. Equation 2 represents a load current for the output voltage of the inverter. The maximum phase shift angle at which the minimum output current specification is satisfied may be confirmed through the two Equations. Phases of a voltage and a current of the inverter 54 at which zero voltage switching (ZVS) is possible may be confirmed from the confirmed maximum phase shift angle.

For example, the resonance inductor 62 and the resonance capacitor 64 is selected so that the zero voltage switching (ZVS) is possible at the maximum phase shift angle in the manner described above, a minimum output current of 30 A is satisfied, and a maximum output current of 40 A at a phase shift angle of 0° may be obtained, thereby selecting a final resonance network.

The resonance network 60 selected in the manner as described above is designed to have the maximum output current of 40 A when θ is 0° and have the minimum output current of 30 A when θ is 85°, at an operation frequency of 400 kHz.

Figure 8:
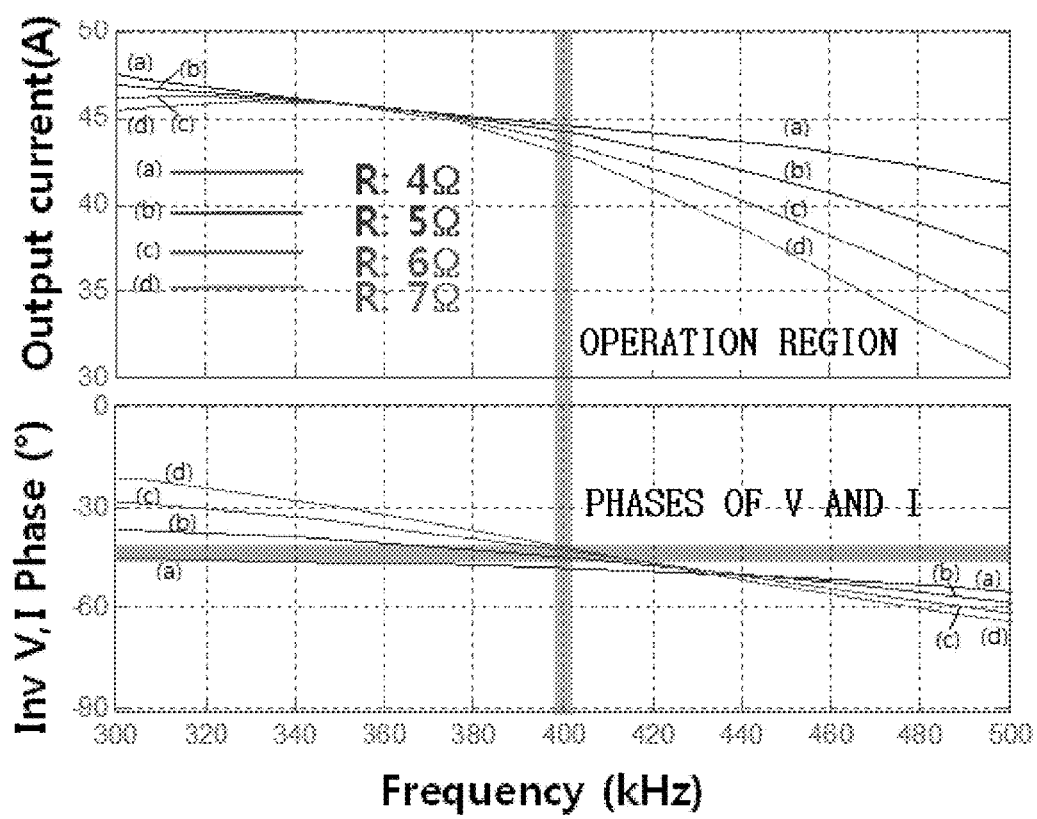
FIG. 8 is graphs illustrating a phase difference between a voltage and a current of an inverter and an output current.

FIG. 8 is graphs illustrating a phase difference between a voltage and a current of an inverter and an output current.

Referring to FIGS. 7 and 8, the resonance network 60 may perform the zero voltage switching (ZVS) at the maximum phase shift angle, and may control an output provided from the power supply apparatus 10 to the plasma generator 20 without a drop-out phenomenon.

Figure 9:
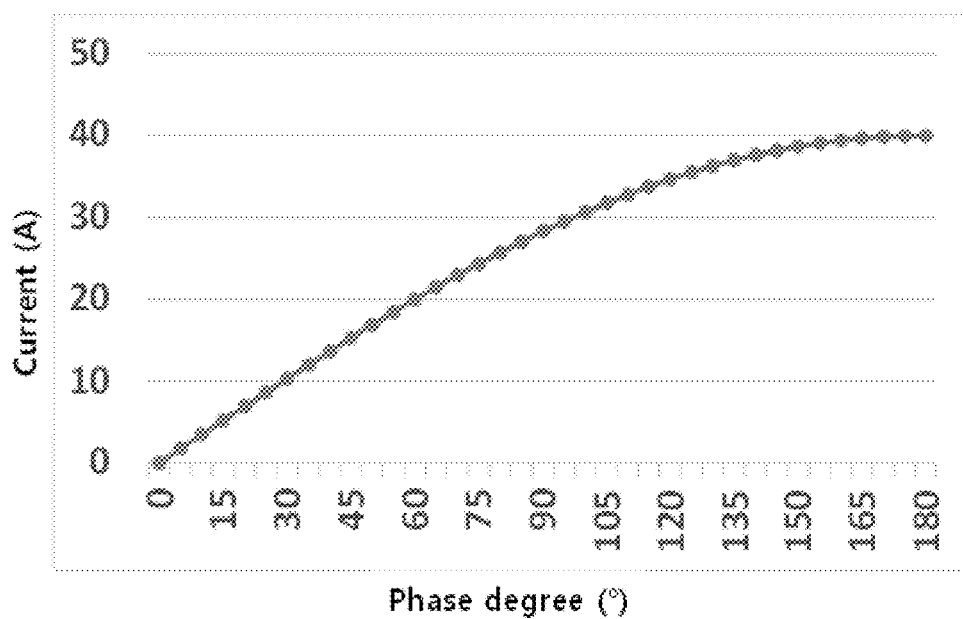
FIG. 9 is a graph illustrating a change in an output current in a power supply apparatus depending on phase shift angles.

FIG. 9 is a graph illustrating a change in an output current in a power supply apparatus depending on phase shift angles.

Referring to FIG. 9, the power supply apparatus 10 according to the present disclosure makes the phase shift through the phase shifter 56 and controls the output current depending on the phase shift angle, thereby making it possible to control the output current through the phase shift manner without performing a frequency control as in the related art. In addition, a drop-out, which is a feature of the plasma after being ignited, is considered when a current is provided from the power supply apparatus. Although a phase shift method of the inverter among manners of controlling the output current is described in the present disclosure, a duty varying method or a DC link voltage controlling method may be used.

Figure 10:
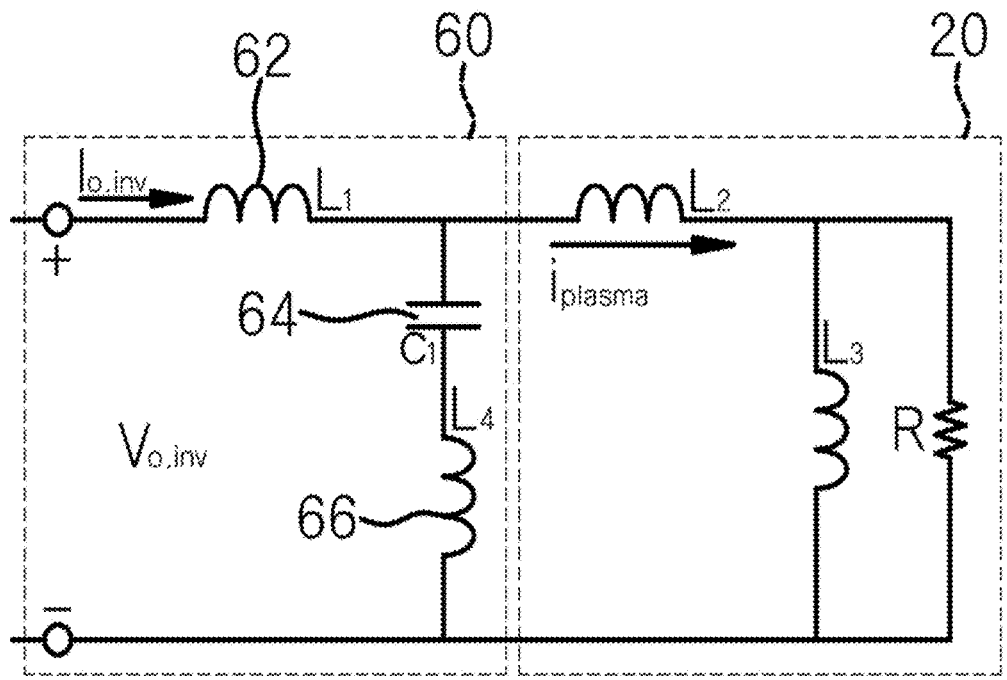
FIG. 10 is a view illustrating another example of a resonance network.

FIG. 10 is a view illustrating another example of a resonance network.

Referring to FIG. 10, a resonance network 60 according to the present disclosure includes a passive element. The passive element means an element that has only a function of transferring or absorbing electrical energy in an electrical circuit, but does not have an active function such as a function of converting the electrical energy, or the like. The passive element is connected to the resonance capacitor 64 in series. In more detail, one end of the passive element is connected to the resonance capacitor 64 in series, and the other end of the passive element is connected to a ground. The passive element may be at least one selected among a resistor, an inductor, a capacitor, a trance, and a relay, and is connected to the resonance capacitor 64 in series. Meanwhile, a reactance value of the passive element described above may be fixed or varied.

In the present disclosure, an inductor 66 among the passive elements is connected to the resonance capacitor 64. In a resonance network according to the related art, a magnitude of a current applied to a load (plasma) may be determined through resonance by the resonance inductor 62 and the resonance capacitor 64. On the other hand, in the resonance network 60 according to the present disclosure, a magnitude of a current of the inverter 54 in the vicinity of a resonance frequency may be adjusted by changing a magnitude of inductance of the inductor 66 which is the passive element. Although not illustrated, inductance of the inductor 66 may varied using a switching circuit connected to the inductor 66, as another exemplary embodiment.

In a situation before the ignition of the plasma in which resistance is close to infinity, the magnitude of the current of the inverter 54 may be reduced by the inductor 66. Therefore, a low current of the inverter 54 may be obtained at the same frequency, such that a phase difference between the voltage and the current of the inverter 54 is easily secured. As a result, the plasma may be ignited even at a switching frequency lower than that of the related art. It is more effective particularly in a current power supply system in which a switching frequency may not be infinitely increased with respect to a resonance frequency.

When the plasma is ignited, a short-circuit current does not flow to the switching power supply 50. Instead, even though inductance of the primary winding 42 of the transformer 40 is reduced after the plasma is ignited, the resonance inductor 62 of the resonance network 60 continuously performs a function as a low pass filter limiting current through the primary winding 42 for a safe operation level for return to the switching power supply 50. Therefore, damage to components in the switching power supply 50 due to a high current is almost prevented.

Hereinafter, calculation of input impedance that is in an inverse proportion of a magnitude of a current of the inverter will be described using Equations.

$$Z_{in} = j\omega L_1 + \frac{-\omega^2 L_2 L_3 + j\omega R(L_2 + L_3)}{R - C_1 R \omega^2 (L_2 + L_3) + j\omega L_3 (1 - C_1 L_2 \omega^2)} \quad \text{[Equation 3]}$$

$$\lim_{R \to \infty} Z_{in.imag} = L_1 \omega + \frac{\omega(L_2 + L_3)}{(1 - C_1 (L_2 + L_3) \omega^2)} \quad \text{[Equation 4]}$$

$Z_{in}$ is impedance from a terminal of a resonant network to a load side

ω: 2*pi*f (pi: 3.141592 . . . , f: frequency of fundamental frequency of resonance network input)

A situation before the ignition of the plasma in which R is ∞ is assumed in order to simplify the impedance.

Equation 3 represents impedance from an inverter to a load according to the related art, and Equation 4 represents impedance before the ignition of the plasma in which characteristics of the plasma are considered in entire impedance from an inverter to a load according to the related art.

Impedance of the inverter 54 may be represented by a resistance equivalent value of the resonance network 60, the plasma generator 30, and the plasma, and a phase difference between a voltage and a current may be recognized and a current value of the inverter may be additionally recognized through real number and imaginary number values of such an impedance value.

Figure 2:
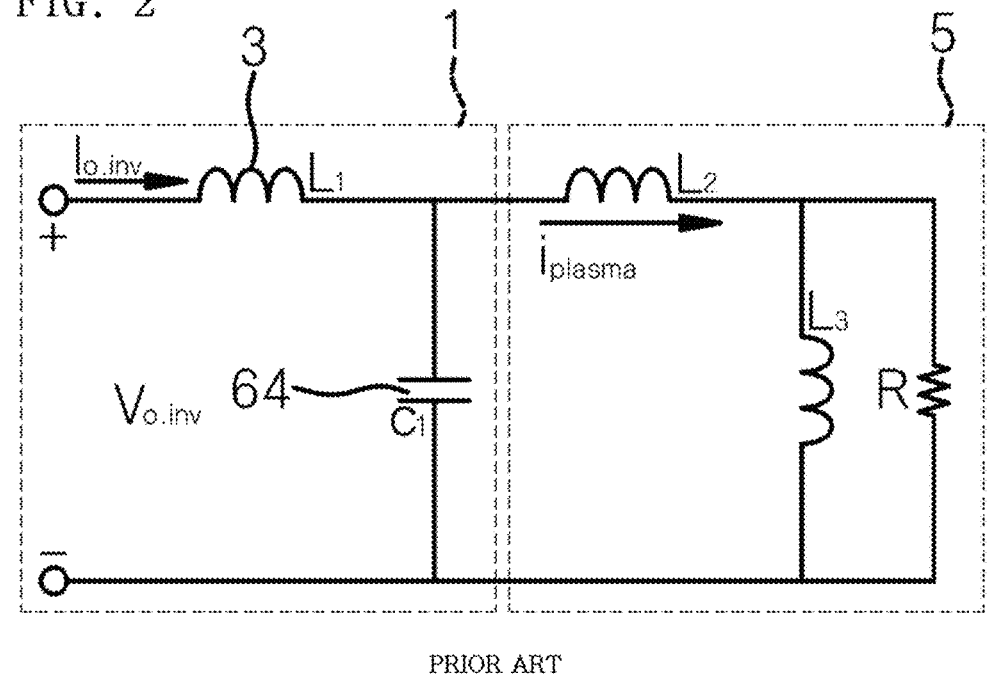
FIG. 2 is a circuit diagram illustrating a resonance network according to the related art and a resonance network of a plasma generator.

In Equation 3, the resonance inductor 3 and the resonance capacitor 4 ($C_1$ in FIG. 2) are used for an operation of the power supply apparatus after the ignition of the plasma, inductors $L_2$ and $L_3$ are portions generated by the plasma generator 20, and there is a limitation in changing values of the inductors $L_2$ and $L_3$ for an entire operation. In a method according to the related art, the resonance network is designed with a focus on an operation of the power supply apparatus after the plasma is ignited, and an operation frequency of the power supply apparatus is increased for an operation before the ignition of the plasma, thereby operating the plasma generator.

$$Z_{in} = sL_1 + \frac{(C_1 L_2 L_3 L_4 \omega^2 - L_2 L_3)\omega^2 + j\omega R(L_2 + L_3)(1 - C_1 L_4 \omega^2)}{R(1 - (L_2 + L_3 + L_4)C_1 \omega^2) + j\omega L_3(1 - (L_2 + L_4)C_1)} \quad \text{[Equation 5]}$$

Equation 5 represents entire impedance from the inverter to the load according to the present disclosure.

$$\lim_{R \to \infty} Z_{in.imag.notch} = L_1 \omega + \frac{\omega(1 - C_1 L_4 \omega^2)(L_2 + L_3)}{1 - C_1 (L_2 + L_3 + L_4)\omega^2} \quad \text{[Equation 6]}$$

Equation 6 represents impedance in which characteristics of the plasma are considered entire impedance from the inverter to the load according to the present disclosure.

Since a real part becomes 0 in a situation in which R is ∞ in a process of calculating the impedance, the real part is omitted, and only an imaginary part is represented. An equation having an influence on the current of the inverter is determined by only the imaginary part in $Z_{in}$ (impedance from the terminal to the load). In this case, a current of the inverter lower than that of according to the related art may be obtained at the same frequency due to an influence of a passive element $L_4$.

When the passive element $L_4$ is added to the resonance network 60 according to the present disclosure, Equation 3 may be changed into Equation 5, and the phase difference between the voltage and the current before the ignition of the plasma may be calculated and improved through the additional passive element $L_4$. In addition, in Equation 6, is the passive element $L_4$ is added, such that magnitudes of the voltage and the current of the inverter 54 may be calculated and adjusted.

As a result, according to the present disclosure, at the time of an operation before the ignition of the plasma, the magnitude of the current of the inverter may be adjusted, such that the current of the inverter lower than that that according to the related art at the same frequency may be obtained. Therefore, the phase difference between the voltage and the current of the inverter is easily secure, and the plasma may be ignited even at a lower switching frequency. In addition, in the situation before the ignition of the plasma in which the resistance is close to the infinity, the magnitude of the current of the inverter may be reduced. Particularly, the power supply apparatus according to the present disclosure is applied to the current power supply system in which the switching frequency may not be infinitely increased with respect to the resonance frequency, thereby making it possible to adjust the magnitude of the current of the inverter at the same frequency.

Figure 11A:
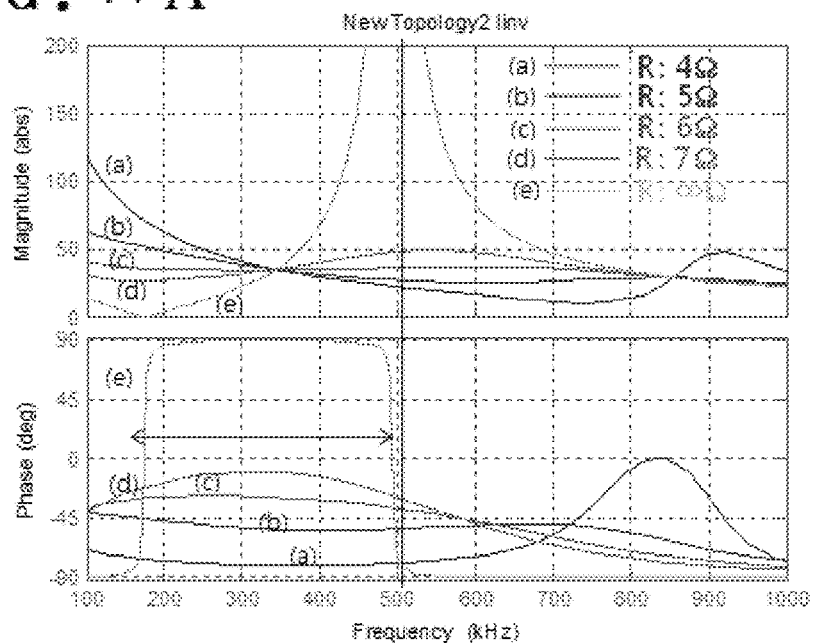
FIGS. 11A and 11B are graphs comparing phases of voltages and currents and magnitudes of the currents of inverters of power supply apparatuses according to the related art and an exemplary embodiment of the present disclosure, respectively.
Figure 11B:
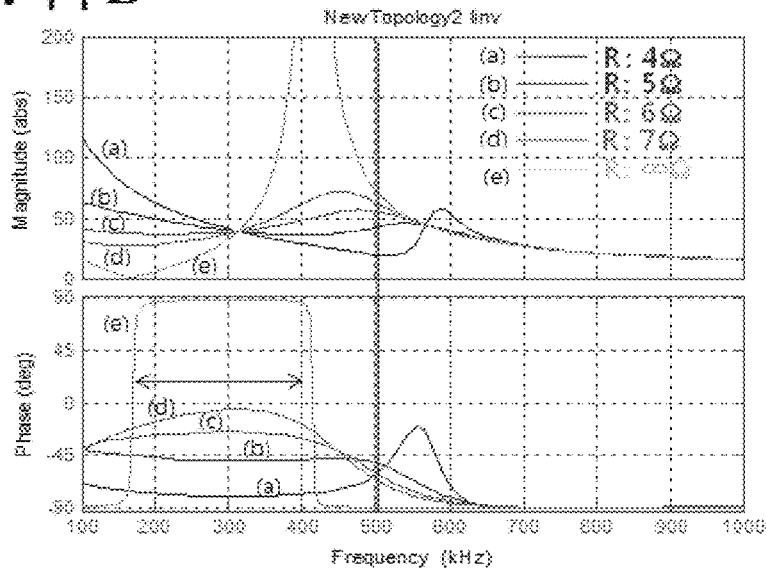

FIGS. 11A and 11B are graphs comparing phases of voltages and currents and magnitudes of the currents of inverters of power supply apparatuses according to the related art and an exemplary embodiment of the present disclosure, respectively.

Referring to FIG. 11A, a section represented by an arrow in an electrical equivalent model behind an inverter in the power supply apparatus according to the related art indicates a section in which zero voltage switching (ZVS) is impossible. Referring to FIG. 11B, a section represented by an arrow in an electrical equivalent model behind an inverter in the power supply apparatus according to the present disclosure indicates a section in which zero voltage switching (ZVS) is impossible. Therefore, when comparing FIGS. 11A and 11B with each other, the power supply apparatus according to the present disclosure may secure a section in which the zero voltage switching (ZVS) is possible using the additional passive element $L_4$. In addition, the magnitude of the current of the inverter may also be adjusted using the additional passive element $L_4$.

Figure 12:
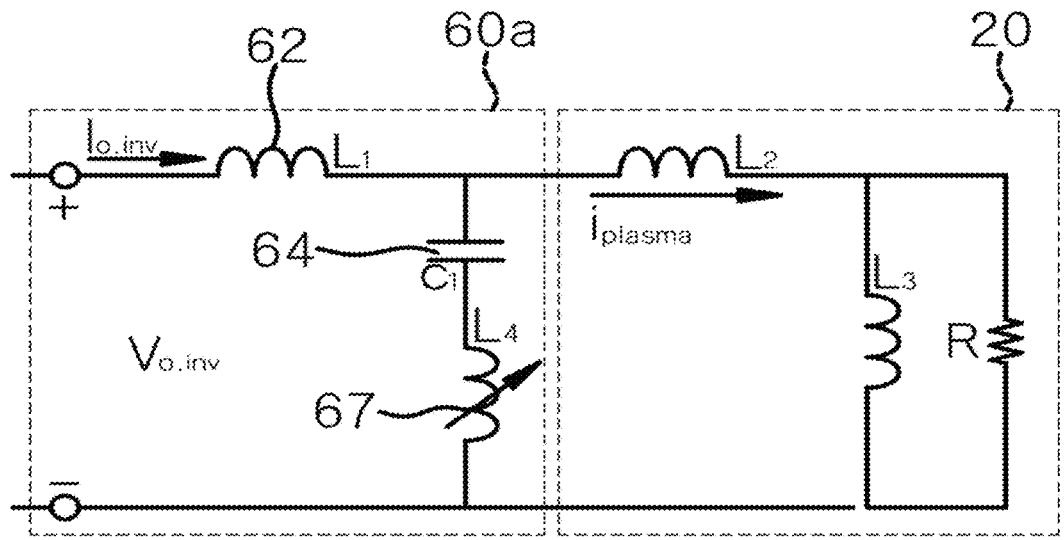
FIG. 12 is a circuit diagram illustrating a resonance network and a plasma generator according to another exemplary embodiment of the present disclosure.

FIG. 12 is a circuit diagram illustrating a resonance network and a plasma generator according to another exemplary embodiment of the present disclosure.

Referring to FIG. 12, a resonance network 60a may use a variable inductor 67 as a passive element. The variable inductor 67 is connected to the resonance capacitor 64 in series. In more detail, one end of the variable inductor 67 is connected to the resonance capacitor 64 in series, and the other end of the variable inductor 67 is connected to a ground. An inductance value may be adjusted using the variable inductor 67 to control magnitudes of a voltage and a current of the inverter. Since component except for the variable inductor 67 are the same as those according to the exemplary embodiment described above, a detailed description therefor will be omitted.

Figure 13:
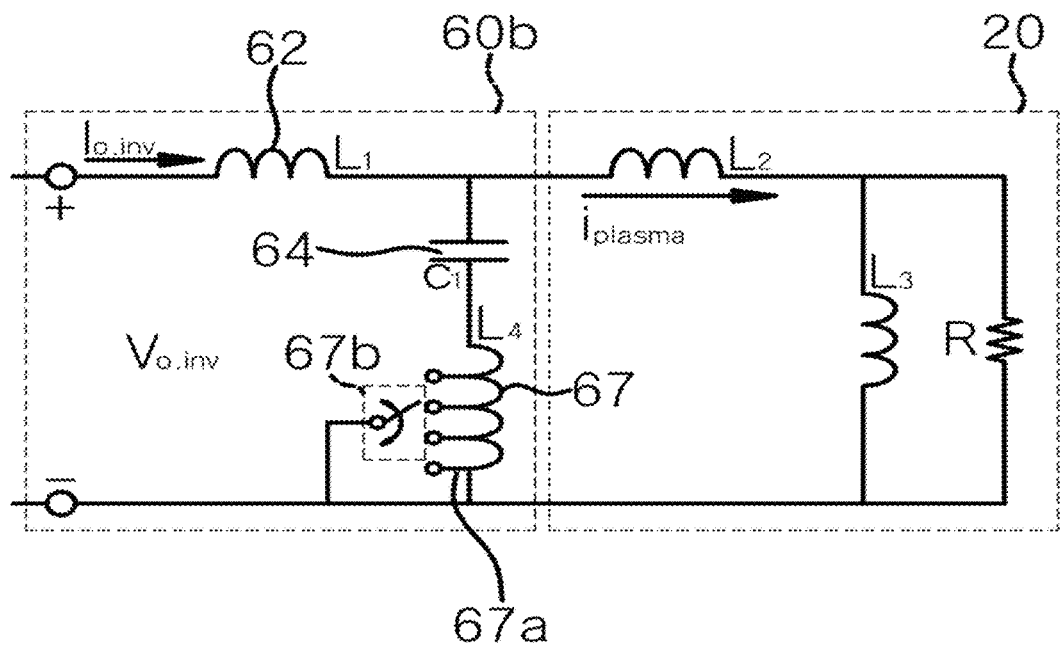
FIG. 13 is a circuit diagram illustrating a resonance network and a plasma generator according to still another exemplary embodiment of the present disclosure.

FIG. 13 is a circuit diagram illustrating a resonance network and a plasma generator according to still another exemplary embodiment of the present disclosure.

Referring to FIG. 13, a resonance network 60b is a resonance network including a modified example of a variable inductor 67, and may adjust an inductance value using a multi-tap 67b. The variable inductor 67 is connected to the multi-tap 67b through a switching circuit 67a, such that a turn of the variable inductor 67 is adjusted to adjust the inductance value. The variable inductor 67 is connected to the resonance capacitor 64 in series. In more detail, one end of the variable inductor 67 is connected to the resonance capacitor 64 in series, and the other end of the variable inductor 67 is connected to a ground. The inductance value may be adjusted using the variable inductor 67 to control magnitudes of a voltage and a current of the inverter. Since component except for the variable inductor 67 are the same as those according to the exemplary embodiment described above, a detailed description therefor will be omitted.

Although not illustrated, the plasma generator 20 may further include an ignition electrode for igniting the plasma. The ignition electrode may be connected to and driven by the power supply apparatus 10. The ignition electrode generates free charges providing an initial ionization event igniting the plasma in the plasma discharge channel 22 having the toroidal shape. The initial ionization event may be a short and high voltage pulse applied to the plasma generator 20. A continuous high radio frequency (RF) voltage may be used to generate the initial ionization event. Ultraviolet (UV) radiation may be used to generate the free charges in the plasma discharge channel 22, providing the initial ionization event igniting the plasma in the plasma discharge channel 22. Alternatively, the plasma generator 20 may be exposed to the UV radiation emitted from an UV light source (not illustrated) optically coupled to the body 24 to generate the initial ionization event igniting the plasma.

Effects of the power supply apparatus able to control an output current and the power supply method using the same according to the present disclosure are as follows.

According to at least one of exemplary embodiments of the present disclosure, the output current of the power supply apparatus may be controlled using the phase shift, such that the drop-out phenomenon after the ignition of the plasma may be avoided. In addition, the output current may be varied with respect to various plasma conditions, such that a semiconductor process may be effectively performed.

Therefore, the abovementioned detailed description is to be interpreted as being illustrative rather than being restrictive in all aspects. The scope of the present disclosure is to be determined by reasonable interpretation of the claims, and all modifications within an equivalent range of the present disclosure fall in the scope of the present disclosure.

What is claimed is:

1. A power supply apparatus able to control an output current for maintaining plasma in a plasma generator, comprising:
    a switching power supply including a rectifier, an inverter, and a phase shifter;
    a transformer including a ferrite core installed in the plasma generator and a primary winding connected to the switching power supply and wound around the ferrite core;
    a resonance network connected between the switching power supply and the plasma source and including a resonance inductor connected to a primary winding in series and a resonance capacitor connected to the plasma source in parallel and connected to the resonance inductor in series;
    a control unit controlling the switching power supply in order to phase-shift a voltage and a current provided to the resonance network; and
    wherein the resonance network further includes an additional inductor having one end connected to the resonance capacitor in series and the other end connected to a ground for increasing a frequency range of zero voltage switching (zvs) of the inverter.

2. The power supply apparatus able to control an output current of claim 1, wherein the inverter comprises a half-bridge inverter.

3. The power supply apparatus able to control an output current of claim 1, wherein the inverter comprises a full-bridge inverter.

4. The power supply apparatus of claim 1, comprising the control unit configured to confirm values of the resonance inductor and the resonance capacitor and the additional inductor at which a maximum output current is output from the resonance network;
    confirming a maximum phase shift angle at which a minimum output current is output from the resonance network;
    confirming phases of a voltage and a current of the inverter at which zero voltage switching (ZVS) is possible at the maximum phase shift angle; and
    controlling an output current of the inverter.

5. The power supply apparatus of claim 2, comprising the control unit configured to confirm values of the resonance inductor the resonance capacitor and the additional inductor at which a maximum output current is output from the resonance network;
    confirming a maximum phase shift angle at which a minimum output current is output from the resonance network;
    confirming phases of a voltage and a current of the inverter at which zero voltage switching (ZVS) is possible at the maximum phase shift angle; and
    controlling an output current of the inverter.

6. The power supply apparatus of claim 3, comprising the control unit configured to confirm values of the resonance inductor the resonance capacitor and the additional inductor at which a maximum output current is output from the resonance network;
    confirming a maximum phase shift angle at which a minimum output current is output from the resonance network;
    confirming phases of a voltage and a current of the inverter at which zero voltage switching (ZVS) is possible at the maximum phase shift angle; and controlling an output current of the inverter.

* * * * *